United States Patent [19]
Howard

[11] 3,934,108
[45] Jan. 20, 1976

[54] LEAD BONDING METHOD AND APPARATUS

[75] Inventor: Norman A. Howard, Cupertino, Calif.

[73] Assignee: Uthe Technology, Inc., Sunnyvale, Calif.

[22] Filed: Sept. 16, 1974

[21] Appl. No.: 506,245

[52] U.S. Cl. ............... 219/85; 219/68; 219/85 CA; 219/85 CM
[51] Int. Cl.² ........................................ B23K 11/10
[58] Field of Search...... 219/57, 68, 85 CA, 85 CM, 219/85 D, 85 F

[56] References Cited
UNITED STATES PATENTS

| | | |
|---|---|---|
| 2,679,570 | 5/1954 | Cisne .................................. 219/68 |
| 3,431,384 | 3/1969 | Cooper ................................. 219/68 |
| 3,524,964 | 8/1970 | Milliman .............................. 219/57 |
| 3,860,782 | 1/1975 | Hamby .......................... 219/85 F X |

Primary Examiner—J. V. Truhe
Assistant Examiner—N. D. Herkamp
Attorney, Agent, or Firm—Limbach, Limbach & Sutton

[57] ABSTRACT

A segment of electrically conductive wire is extended through a collet in a capillary tool and is mechanically bonded at one extended portion to a circuit point. Thereafter, an electric current having a decreasing ramp-shaped waveform is applied to the portion of the wire between the bonded circuit point and the collet to resistively heat the wire until it ruptures and forms integral balls on the ends of the wire at the rupture.

7 Claims, 6 Drawing Figures

U.S. Patent Jan. 20, 1976 3,934,108
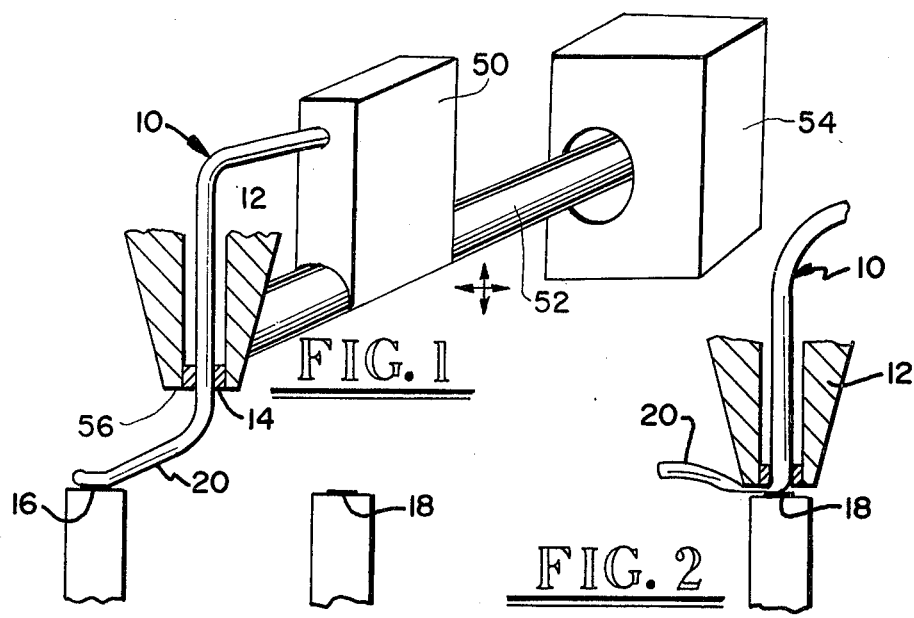
FIG. 1
FIG. 2
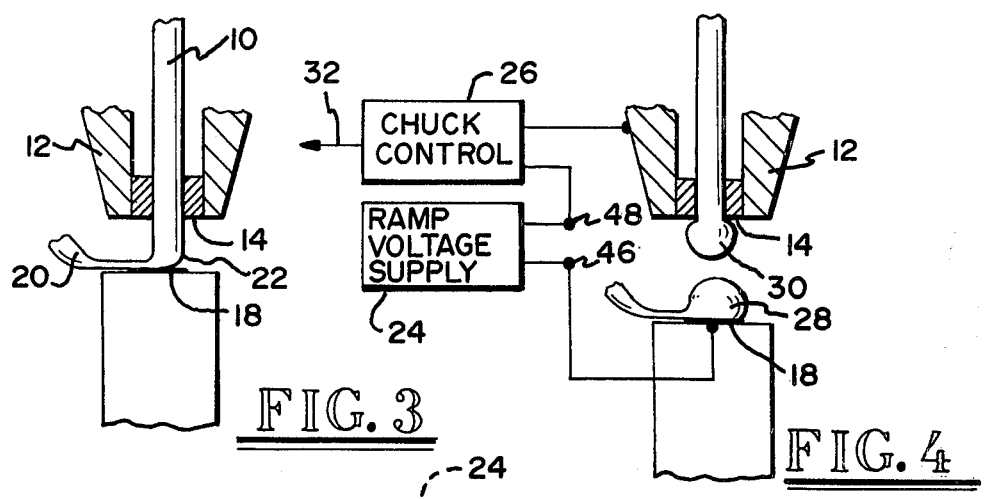
FIG. 3
FIG. 4
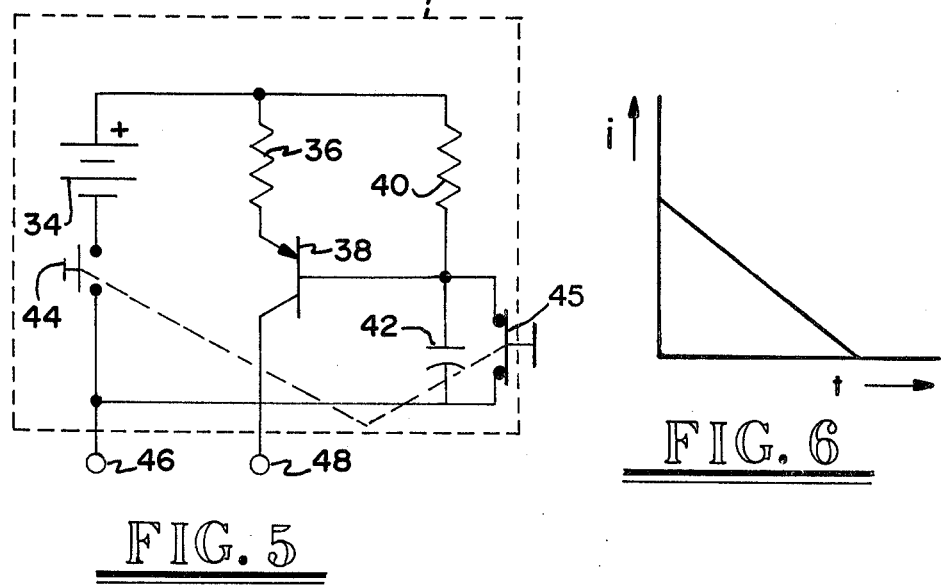
FIG. 5
FIG. 6

LEAD BONDING METHOD AND APPARATUS

BACKGROUND OF THE INVENTION

This invention relates to an improvement in a method and apparatus for accomplishing lead bonding to electrical circuits.

In the manufacture of semiconductor devices, a large number of circuits are formed on a single semiconductor slice and certain points in the various circuits are connected together by an electrical conductor having a very small cross-sectional area. Such a wire may be as small as one circular mil. There are various ways in which the ends of the wires may be attached to the circuit point, such as by thermocompression, eutectic bonding, or ultrasonic bonding. The wire in such methods is typically extended through a hollow, capillary type tool which is lowered to the circuit point to which the wire is to be attached. One technique which is sometimes used in these methods, and particularly in the thermocompression type bonding, is to form the extended end of the wire into a ball having a diameter greater than the diameter of the wire to which it is attached. The capillary tool is then used to press this balled end of the wire against the circuit point to which it is to be attached and the capillary tool and circuit point and wire are heated to a predetermined temperature to effect the bond. The capillary tool is then raised, while simultaneously extending additional wire out of the tool, and is moved to a second circuit point. The capillary tool is pressed downwardly to mechanically bond a second portion of the wire to a second circuit point and is then raised again. The portion of the wire extending between the capillary tool and the second circuit point is then severed, either by simply putting the wire in tension until it breaks, or by flame heating it until it is severed. One disadvantage of the first technique is that the length of wire left extending from the capillary tool must then be heated to form another ball. This requires an additional step in the operation and since it is desirable to minimize the number of steps in such operations, this is a disadvantage. Also the capillary tool must move in only one predetermined direction while breaking the wire. This limits its mobility and increases the time required to perform a large number of lead bonding operations. A disadvantage in the flame severing type of operation is that a pigtail is left on the circuit board. The pigtail is a small portion of the wire which extends upwardly from the second circuit point to the end of the wire where the flame severed it. This portion must be removed by a time consuming manual operation to prevent it from contacting any other part of the circuit.

SUMMARY OF THE INVENTION

The above and other disadvantages of the prior art are overcome by the present invention of an improved lead bonding apparatus of the type in which a segment of electrically conductive wire is extended through a capillary tool and is mechanically bonded along different portions of its length to separate circuit points, wherein the improvement comprises means in contact with the length of wire at the capillary tool for establishing a heat sink and means for applying an electric current in a portion of the wire between the capillary tool and a select one of the circuit points to which one portion of the wire is bonded to thereby resistively heat that portion of the wire until it ruptures and forms integral balls on the ends of the wire at the rupture.

In the preferred embodiment, the electric current means generate a decreasing ramp-shaped waveform and the heat sink means comprise a collet which is snug-fitted about the wire and is mounted in the end of the capillary tool. The circuit point to which the wire is attached and the collet act as heat sinks, thereby preventing those portions of the wire which are in contact with them from becoming so hot from the resistive heating that they will melt. Thus only the intermediate portion of the wire is ruptured by the resistive heating. In the preferred embodiment, means are provided for sensing the interruption of the current in the portion of the wire when it ruptures and for generating a position control signal for moving the capillary tool relative to the circuit. Since the capillary tool need not move to accomplish the severing, as in the tension severing method, the tool is free to move in any direction immediately after the severing, thus effecting a savings in manufacturing time.

It is therefore an object of the present invention to provide an improved lead bonding apparatus in which the wire is severed from a mechanical bond to the circuit point by means of an decreasing ramp-shaped electric current which simultaneously ruptures the wire and forms balls on the ends of the wire at the rupture.

It is another object of the invention to provide a lead bonding apparatus which severs the wire from the circuit point to which it is bonded without leaving a pigtail.

The foregoing and other objectives, features and advantages of the invention will be more readily understood upon consideration of the following detailed description of certain preferred embodiments of the invention, taken in conjunction with the accompanying drawings.

BRIEF DESCRIPTION OF THE DRAWINGS

FIGS. 1, 2, 3 and 4 are side views, partly in section, illustrating the various steps in the lead bonding sequence according to one embodiment of the invention;

FIG. 5 is a schematic diagram of a ramp current generating circuit; and

FIG. 6 is a waveform of the current generated by the circuit depicted in FIG. 5.

DETAILED DESCRIPTION OF CERTAIN PREFERRED EMBODIMENTS OF THE INVENTION

As shown in FIG. 1, a wire 10 is fed from a source 50 through an electrically heated capillary tool 12 which is otherwise conventional except that it is provided with a collet 14 fitted in its lowermost end. The capillary tool 12 and the wire source 50 are mounted on the end of an actuator arm 52 of a conventional bonding machine 54. The portion of the wire which has been extended through the collet 14 is bonded to a grounded, first circuit point 16 by any of the variety of mechanical bonding techniques referred to above, such as thermocompression. The wire 10 is then paid out through the capillary tool 12 and the collet 12 as the capillary tool is moved relative to the circuit point 16 until it is over a grounded, second circuit point 18. The portion of wire extending between the circuit point 16 and the circuit point 18 is referenced for purposes of this description by the numeral 20. The end of the portion of the wire 20 at the circuit point 18 is then mechanically bonded, such as by thermocompression, under the force of the electrically heated bonding surface 56 of the lowered capillary tool 12 against the circuit point 18 as is illustrated in FIG. 2.

The capillary tool 12 is then raised and more wire 10 is paid out leaving a portion 22 extending between the collet 14 and the circuit point 18. An electric current is supplied from a source 24 connected in series with a chuck control circuit 26 between the capillary tool 12 and the circuit point 18. The capillary tool 12 makes contact with the wire 10 through the collet 14.

The collet 14 and the circuit point 18 act as heat sinks for the portions of the wire with which they are in contact and the intermediate portion 22 of wire extending between them thus heats to a higher temperature than these portions. When the intermediate portion 22 is resistively heated to the melting point temperature, the wire ruptures and forms a ball 28 on the portion of the wire at the circuit point 18 and a ball 30 on the end of the wire 10 extending from the capillary tool 12 and adjacent to the bonding surface 56. These balls 28 and 30 are formed because the molten wire attempts to take a shape having the smallest surface area, which is a sphere. No pigtail is formed because, in contrast to flame severing, the entire intermediate portion is heated to the melting point.

When the portion 22 ruptures due to the resistive heating, the current through the chuck control circuit 26 is interrupted and it generates a control signal to the bonding machine 54 on a lead 32 which causes the capilllary tool 12 to move relative to the circuit points 16 and 18 to reposition the capillary tool over new circuit points. The mechanism 54 for moving the capillary tool 12 is not shown since such mechanisms are well known to those skilled in the art and are not a part of the present invention. One such mechanism is described in U.S. Pat. No. 3,776,447, for example. Other bonding machines and capillary tool control mechanisms are disclosed in U.S. Pat. Nos. 3,430,835 and 3,767,101.

The magnitude of the current density passed through the intermediate portion of the wire is important. If the current density is too high the intermediate portion will be blown out of the gap between the capillary tool and the circuit point and will not form the balled ends. If the current density is too low, the intermediate portion will just soften to the point where it breaks and falls back onto the circuit, without forming balled ends. The magnitude of the current depends on the material used for the wire and its diameter. It has also been found that a decreasing ramp-shaped current waveform is most effective.

Referring now more particularly to FIG. 5, a circuit diagram of the ramp-shaped current supply source 24 is illustrated. The positive terminal of a voltage source 34, which may be a battery but is more typically an external power supply, is connected through a resistance 36 to the emitter electrode of a PNP, power transistor 38 and through a resistance 40 to the base electrode of the transistor 38. The base electrode of the transistor 38 is also connected through a capacitor 42 to one terminal of a pushbutton switch 44 and to an external terminal 46. The other terminal of the switch 44 is connected to the negative terminal of the power supply 34. The collector electrode of the transistor 38 is connected to a second external terminal 48. The terminal 48 is connected through the chuck control circuit 26 to the capillary tool 12 and the terminal 46 is connected to the lead-bonded circuit point 18.

When the switch 44 is closed, the current flows through the resistor 40 thereby charging the capacitor 42 and building up the base bias voltage applied to the transistor 38. As the base bias voltage is increased, the transistor 38 becomes increasingly less conductive and a decreasing, ramp-shaped current waveform is developed in the circuit connected between the terminals 46 and 48 which, in fact, is the wire portion 22. Such a decreasing ramp-shaped waveform is illustrated in FIG. 6.

In one example of the method and apparatus of the invention, a one mil diameter aluminum wire, of approximately 25 mils in length, was ruptured intermediate the circuit point to which it was bonded and the capillary tool by the application of 13 amps peak current from a circuit, such as is shown in FIG. 5, when powered by a 12 volt source 34. Integral balls were formed on the ends of the wire at the rupture. Gold wire is also suitable for use with this invention.

To discharge the capacitor 42 for repeated operations, a normally closed switch 45 is connected in parallel with the capacitor. The switch 45 is preferably ganged with the switch 44 so that when the switch 44 is closed the switch 45 is opened.

The terms and expressions which have been employed here are used as terms of description and not of limitation, and there is no intention, in the use of such terms and expressions, of excluding equivalents of the features shown and described, or portions thereof, it being recognized that various modifications are possible within the scope of the invention claimed.

What is claimed is:

1. An improved lead bonding apparatus of the type in which a segment of electrically conductive wire is extended through a capillary tool having a bonding surface and is mechanically bonded along different portions of its length to separate circuit points by being pressed against the circuit points by the capillary tool bonding surface, wherein the improvement comprises:
   means in contact with the length of wire at the capillary tool for establishing a heat sink at the bonding surface and
   means for producing an electric current of such shape and magnitude in a portion of the wire between the capillary tool and a select one of the circuit points to which the wire is bonded to resistively heat that portion of the wire such that it ruptures and forms integral balls on the ends of the wire at the capillary tool bonding surface and at the circuit point.

2. An improved bonding apparatus as recited in claim 1 wherein the electric current has a decreasing ramp-shaped waveform.

3. An improved bonding apparatus as recited in claim 1 wherein the heat sink means comprises a collet mounted in the capillary tool and snug-fitted about the wire.

4. An improved lead bonding apparatus as recited in claim 1 further comprising means for sensing the interruption of current in the portion of the wire when it ruptures and for generating a position control signal for moving the capillary tool relative to the circuit points.

5. An improved lead bonding method of the type wherein a segment of electrically conductive wire is extended through a capillary tool having a bonding surface and is mechanically bonded by the capillary tool along different portions of its length to separate circuit points; wherein the improvement comprises the steps of placing the length of wire in contact with a heat sink adjacent the bonding surface of the capillary tool and producing an electric current of such shape and magnitude in a portion of the wire between the capillary tool and a select one of the circuit points to which the wire is bonded so as to resistively heat the wire portion and rupture it, forming integral balls on the ends of the wire at the capillary tool bonding surface and the circuit point.

6. An improved lead bonding method as recited in claim 5 wherein the step of applying the electric current includes applying a current having a decreasing ramp-shaped waveform.

7. An improved lead bonding method as recited in claim 5 wherein the heat sink contacting step comprises holding the wire in a collet adjacent to the bonding surface in the capillary tool.

* * * * *